United States Patent
Kim et al.

(10) Patent No.: US 8,207,530 B2
(45) Date of Patent: Jun. 26, 2012

(54) OXIDE SEMICONDUCTOR AND THIN FILM TRANSISTOR INCLUDING THE SAME

(75) Inventors: Sang-wook Kim, Yongin-si (KR);
Sung-ho Park, Yongin-si (KR);
Chang-jung Kim, Yongin-si (KR);
Sun-il Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 253 days.

(21) Appl. No.: 12/654,343

(22) Filed: Dec. 17, 2009

(65) Prior Publication Data
US 2010/0176393 A1    Jul. 15, 2010

(30) Foreign Application Priority Data
Jan. 9, 2009    (KR) .................. 10-2009-0001942

(51) Int. Cl.
*H01L 29/10*    (2006.01)
*H01L 29/12*    (2006.01)
(52) U.S. Cl. ................ 257/43; 257/57; 257/59; 257/72; 257/E29.296
(58) Field of Classification Search .................. 257/43, 257/57, 59, 72, E29.296
See application file for complete search history.

(56) References Cited

U.S. PATENT DOCUMENTS

| | | | |
|---|---|---|---|
| 7,008,833 B2 | 3/2006 | Li et al. | |
| 7,067,843 B2 | 6/2006 | Carcia | |
| 7,339,187 B2 | 3/2008 | Wager, III | |
| 7,374,984 B2 | 5/2008 | Hoffman | |
| 2007/0023750 A1* | 2/2007 | Chiang et al. | 257/43 |
| 2008/0023703 A1 | 1/2008 | Hoffman | |
| 2008/0308826 A1* | 12/2008 | Lee et al. | 257/98 |
| 2009/0090914 A1 | 4/2009 | Yano | |
| 2009/0101948 A1* | 4/2009 | Park et al. | 257/292 |
| 2010/0052066 A1* | 3/2010 | Yu et al. | 257/369 |

FOREIGN PATENT DOCUMENTS

| | | |
|---|---|---|
| JP | 2002-114516 | 4/2002 |
| JP | 2006-098664 | 4/2006 |
| KR | 10-2008-0052107 | 6/2008 |
| KR | 10-2008-0076698 | 8/2008 |
| KR | 10-2008-0076747 | 8/2008 |
| KR | 10-2008-0079906 | 9/2008 |
| WO | WO 2007/058248 | 5/2007 |

\* cited by examiner

*Primary Examiner* — Tu-Tu Ho
(74) *Attorney, Agent, or Firm* — Harness, Dickey & Pierce, P.L.C.

(57) ABSTRACT

Provided are an oxide semiconductor and a thin film transistor including the oxide semiconductor. The oxide semiconductor may be formed of indium (In) oxide and hafnium (Hf) and may be a channel material of the thin film transistor.

18 Claims, 6 Drawing Sheets

OXIDE SEMICONDUCTOR AND THIN FILM TRANSISTOR INCLUDING THE SAME

CROSS-REFERENCE TO RELATED APPLICATIONS

This application claims priority under 35 USC §119 to Korean Patent Application No. 10-2009-0001942, filed on Jan. 9, 2009, in the Korean Intellectual Property Office (KIPO), the entire contents of which are incorporated herein by reference.

BACKGROUND

1. Field

Example embodiments relate to an oxide semiconductor and a thin film transistor (TFT) including the oxide semiconductor, and more particularly, to a semiconductor material including a material added to an indium oxide, and an oxide TFT including the semiconductor material.

2. Description of the Related Art

Thin film transistors are applied in various application fields, and may be used as switching and driving devices in the field of display and a selector switch of a cross point type memory device.

Because liquid crystal displays (LCDs) are actively being used as television (TV) panels, research into organic light emitting displays has been conducted to be applied to TVs. Display technology for TVs has been developed to meet market demands. The market demands include TVs having a larger size, digital information displays (DIDs), a lower price and/or improved quality (moving picture file expression, high resolution, brightness, contrast ratio, and color reproduction). In order to meet such demands, a substrate formed of a glass, is required to be enlarged and thin film transistors (TFTs) are required to be applied as switching and driving devices of displays to have improved performance.

To form switching and driving devices of displays, amorphous silicon (a-Si) TFTs may be used. Amorphous silicon (a-Si) TFTs may be formed uniformly on a large surface, having a size of about 2 m or greater for a lower price, and thus, are being widely used. However, to be both large-sized and high-quality, displays having high performance switching and driving devices are required. Thus, the use of a-Si TFTs, having mobility of about 0.5 cm2/Vs, may be limited. Thus, TFTs having mobility that is higher than that of a-Si TFTs and a manufacturing method thereof are needed.

Therefore, because polycrystalline silicon (poly-Si) TFTs, having significantly higher performance than that of a-Si TFTs, have higher mobility of several tens to several hundred cm2/Vs, poly-Si TFTs may be applied in higher-quality displays. Deterioration problems are generated less frequently in devices having poly-Si TFTs than in devices having a-Si TFTs. However, in order to manufacture poly-Si TFTs, more complex processes than those of a-Si TFTs are required, thereby adding additional expenses. Thus, poly-Si TFTs may be applied to high quality displays or OLEDs but are not appropriate in terms of cost compared to a-Si TFTs. Thus, application of poly-Si TFTs is limited. Also, in a poly-Si TFT, due to problems, e.g., limitation of manufacturing equipments and defects, manufacturing processes using larger substrates having a size of 1 m or above are not being conducted, and thus, applying poly-Si TFTs to TVs is difficult.

Accordingly, TFT technology having advantages of both a-Si TFTs and poly-Si TFTs is required. Research into TFT technology is actively being conducted and is mainly focused on an oxide semiconductor device.

Zinc oxide (ZnO)-based TFTs are the main focus for use in the oxide semiconductor device. Zinc oxide (ZnO)-based materials may include a Zn oxide, an In-Zn oxide, and oxides doped with Ga, Mg, Al and/or Fe. Because ZnO-based semiconductor devices may be manufactured at a lower temperature and into an amorphous state, ZnO-based semiconductor devices have an advantage in having a large surface area. In addition, a ZnO-based film has higher mobility, and thus, has improved electrical properties when compared with polycrystalline silicon.

Moreover, research into application of indium oxide (InO)-based materials as channel materials of the TFT is also being conducted. In related art, a TFT showing an enhancement mode characteristic, in which an InO material is applied to a channel, is disclosed. Also, in related art, a TFT using a metal oxide semiconductor, wherein the metal oxide includes an InO material, is disclosed. Moreover, related art discloses doping of InO materials with materials, e.g., zinc (Zn), copper (Cu), magnesium (Mg), cobalt (Co), or calcium (Ca), and applying the doped InO materials to channel materials, and doping of an InO material with cerium dioxide (CeO) and applying the doped InO material to the channel material.

SUMMARY

Example embodiments may include an oxide semiconductor including a new material added to an indium (In) oxide. Example embodiments may include an oxide thin film transistor (TFT), in which the oxide semiconductor is used in a channel region. Additional aspects will be set forth in part in the description which follows and, in part, will be apparent from the description, or may be learned by practice of example embodiments.

According to example embodiments, an oxide semiconductor may include an indium (In) oxide and hafnium (Hf). An atomic ratio of Hf may be in the range of about 0 at %<Hf(at %)≦10 at %. The atomic ratio of Hf is in the range of about 0 at %<Hf(at %)≦2 at % or about 0 at %<Hf(at %)≦1.5 at %. The oxide semiconductor may be amorphous, may have a mixed amorphous and crystalline structure or may have a crystalline structure. The oxide semiconductor may further include Group I elements, Group II elements, Group III elements, Group IV elements, Group V elements, or lanthanide (Ln) based elements.

According to example embodiments, an oxide thin film transistor may include a gate; a channel including the oxide semiconductor of example embodiments, corresponding to the gate; a gate insulating layer between the gate and the channel; and a source and a drain contacting opposite sides of the channel.

An atomic ratio of Hf may be in the range of about 0 at %<Hf(at %)≦10 at %. The atomic ratio of Hf may be in the range of about 0 at %<Hf(at %)≦2 at % or about 0 at %<Hf(at %)≦1.5 at %. The oxide semiconductor may be amorphous, may have a mixed amorphous and crystalline structure or may have a crystalline structure. The channel may further include Group I elements, Group II elements, Group III elements, Group IV elements, Group V elements, or lanthanide (Ln) based elements. The gate, the source and the drain may be formed of titanium (Ti), platinum (Pt), ruthenium (Ru), gold (Au), silver (Ag), molybdenum (Mo), aluminum (Al), tungsten (W), copper (Cu), IZO (InZnO) or AZO (AlZnO). The gate insulating layer may be formed of silicon dioxide ($SiO_2$), a high-k material having higher permittivity than that of $SiO_2$, or a mixture thereof. The oxide thin film transistor may be of a bottom gate type or top gate type.

According to example embodiments, a display may include the oxide thin film transistor of example embodiments as a switching device. According to example embodiments, indium (In) oxide and hafnium (Hf) are added in the oxide semiconductor, thereby providing the oxide semiconductor having high stability, reliability and electric property, and the oxide thin film transistor including the oxide semiconductor.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1A:
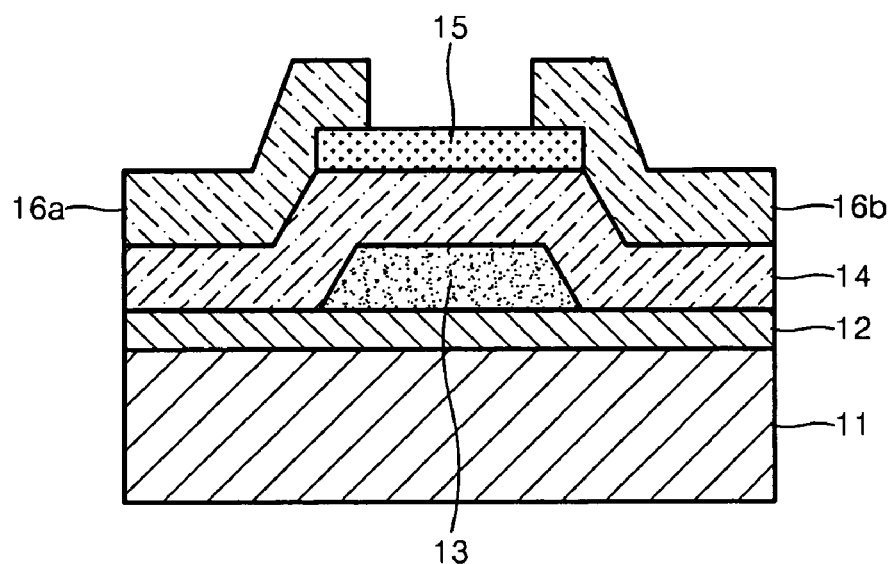
FIGS. 1A and 1B are cross sectional views of a thin film transistor (TFT) including an oxide semiconductor, according to example embodiments.

Hereinafter, an oxide semiconductor, an oxide thin film transistor (TFT) including the oxide semiconductor, and a method of manufacturing the TFT will be described more fully with reference to the accompanying drawings. In the drawings, the sizes and thicknesses of layers are exaggerated for clarity. In this regard, example embodiments may have different forms and should not be construed as being limited to the descriptions set forth herein.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Oxide semiconductors according to example embodiments may include an indium (In) oxide in which hafnium (Hf) is added. The oxide semiconductor may be amorphous, have a mixed amorphous and crystalline structure, or have a crystalline structure.

During processing of an indium (In) oxide, the carrier concentration may be easily changed such that stable TFT characteristics may be difficult to obtain. In example embodiments, an indium (In) oxide is doped with hafnium (Hf), thereby reducing carrier density and/or securing stable TFT characteristics. Hafnium (Hf) may be used as a doping material.

In oxide semiconductors according to example embodiments, an atomic ratio of Hf may be in the range of about 0 at %<Hf(at %)≦10 at %. In addition, an atomic ratio of Hf may be in the range of about 0 at %<Hf(at %)≦2 at % or about 0 at %<Hf(at %)≦1.5 at %.

Oxide semiconductors may further include Group I elements, e.g., lithium (Li) and potassium (K), Group II elements, e.g., magnesium (Mg), calcium (Ca), and strontium (Sr), Group III elements, e.g., gallium (Ga), aluminum (Al), indium (In), and yttrium (Y), Group IV elements, e.g., titanium (Ti), zirconium (Zr), silicon (Si), tin (Sn), and germanium (Ge), Group V elements, e.g., tantalum (Ta), vanadium (V), niobium (Nb), and antimony (Sb), and Lanthanide (Ln) based elements, e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Oxide semiconductors according to example embodiments may include a channel material of a driving transistor used in liquid crystal displays (LCDs) and organic light emitting diodes (OLEDs), or a channel material of transistors forming a peripheral circuit of a memory device, or a channel material of a selector transistor.

Figure 1B:
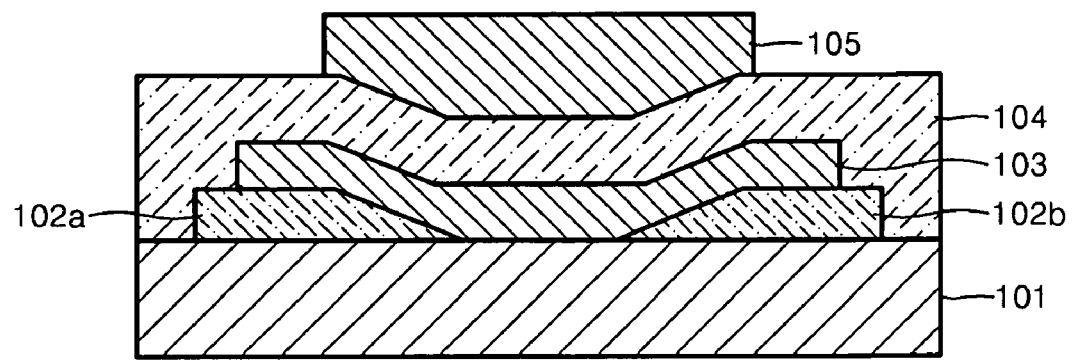

FIGS. 1A and 1B are cross sectional views of an oxide TFT including an oxide semiconductor according to example embodiments. FIG. 1A illustrates a bottom gate type TFT and FIG. 1B illustrates a top gate type TFT. Referring to FIG. 1A, an oxide TFT according to example embodiments may include a gate electrode 13 formed on one region of a substrate 11, and a gate insulating layer 14 formed on another region of the substrate 11 and the gate electrode 13. Furthermore, when the substrate 11 is formed of silicon, an oxide layer 12 may be disposed on the silicon substrate 11 by a thermal oxidation process. A channel 15 may be formed on the gate insulating layer 14 to correspond to the gate electrode 13, and a source 16A and a drain 16B may be formed, respectively, on opposite sides of the channel 15 and on the gate insulating layer 14.

Referring to FIG. 1B, an oxide TFT according to example embodiments may include a source 102a and drain 102b formed on a substrate 101, and a channel 103 formed connecting the source 102a and the drain 102b. A gate insulating layer 104 may be formed on the channel 103 and the substrate 101 and a gate electrode 105 may be formed on the gate insulating layer 104 to correspond to the channel 103. Furthermore, when the substrate 101 is formed of silicon, an oxide layer (not shown) may be disposed on the substrate 101 by a thermal oxidation process.

Materials for each layer in the oxide TFT according to example embodiments illustrated in FIGS. 1A and 1B may be as follows. The substrates 11 and 101 may be any substrate used in a semiconductor device and may be formed of, for example, silicon, glass, or an organic material. The oxide layer 12, formed on the substrate 11 in FIG. 1A, may be a silicon oxide ($SiO_2$) layer formed by thermally oxidizing, for example, a silicon substrate. The gate electrodes 13 and 105 may be formed of a conductive material, for example, a metal, e.g., titanium (Ti), platinum (Pt), ruthenium (Ru), gold (Au), silver (Ag), molybdenum (Mo), aluminum (Al), tungsten (W), or copper (Cu), or metals or conductive oxides, e.g., IZO (InZnO) or AZO (AlZnO). The gate insulating layers 14 and 104 may be formed of an insulating material used in a semiconductor device, for example, $SiO_2$, a high-k material having higher permittivity than that of $SiO_2$, e.g., $HfO_2$, $Al_2O_3$, or $Si_3N_4$, or a mixture thereof. The sources 16a and 102a and the drains 16b and 102b may be formed of conductive materials, for example, metals, e.g., Ti, Pt, Ru, Au, Ag, Mo, Al, W, or Cu, or metals or conductive oxides, e.g., IZO or AZO.

Figure 2A:
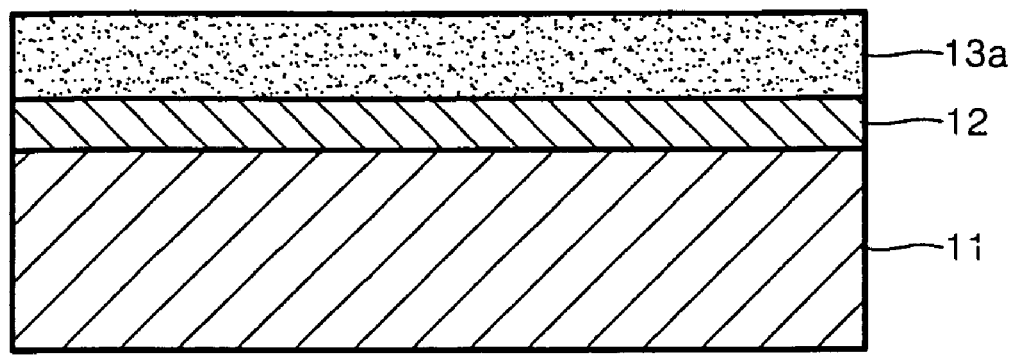
FIGS. 2A through 2E are cross sectional views illustrating a method of manufacturing an oxide TFT, according to example embodiments.

Hereinafter, a method of manufacturing the oxide TFT according to example embodiments is described with reference to FIGS. 2A through 2E. Referring to FIG. 2A, the substrate 11 may be prepared. The substrate 11 may be formed of silicon, glass, or an organic material. When the substrate 11 is formed of silicon, the oxide layer 12 may be formed on the surface of the substrate 11 by a thermal oxidation process. A conductive material 13a, e.g., a metal or a conductive metal oxide, may be provided, for example, coated on the substrate 11.

Figure 2B:
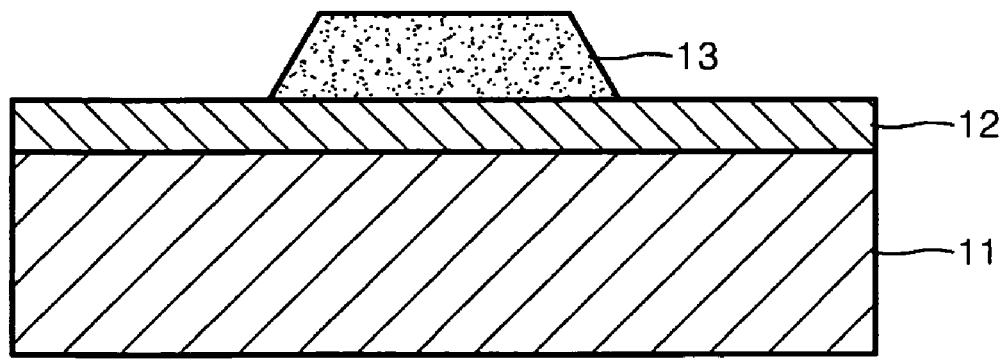
Figure 2C:
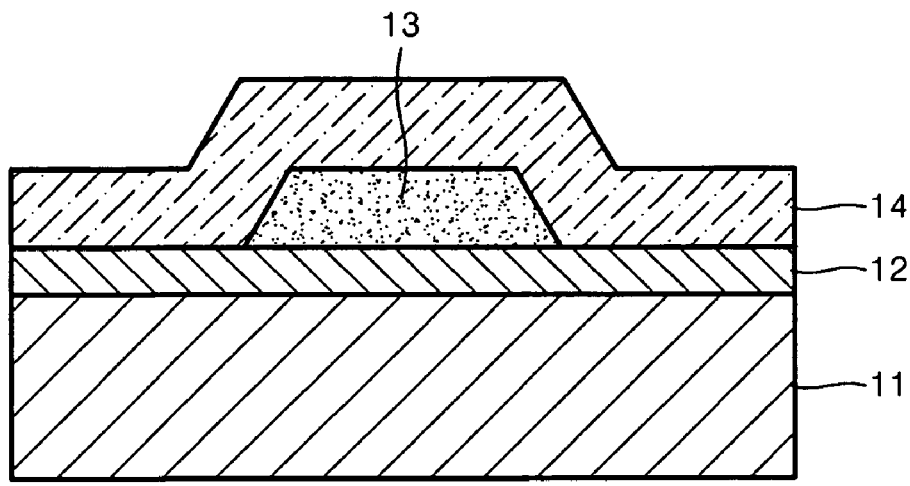

Referring to FIG. 2B, the conductive material 13a may be patterned to form the gate electrode 13. Referring to FIG. 2C, an insulating material may be provided, for example, coated on the gate electrode 13 and may be patterned to form the gate insulating layer 14. The gate insulating layer 14 may be formed of a silicon oxide, a silicon nitride, a hafnium (Hf) oxide, an aluminum oxide, or a mixture of a hafnium (Hf) oxide and an aluminum oxide.

Figure 2D:
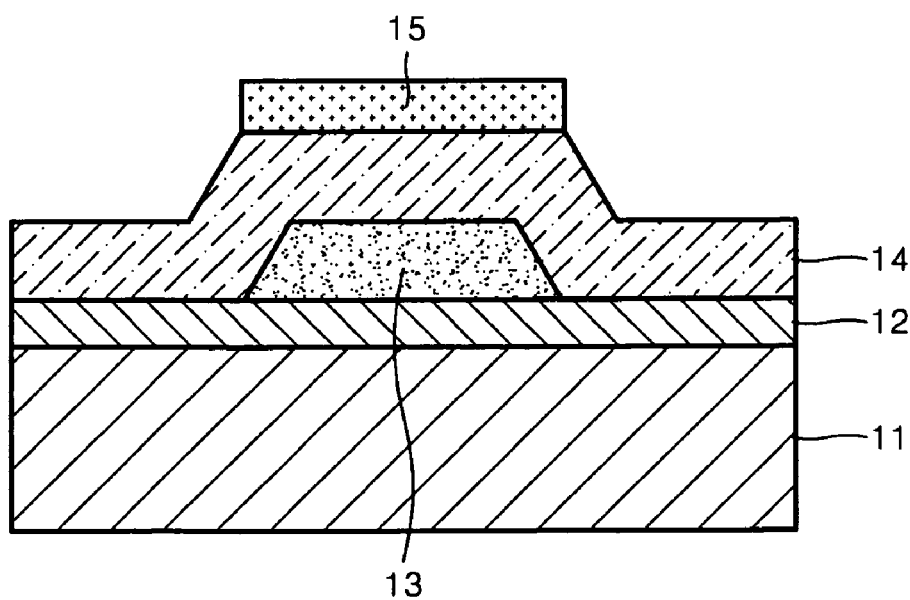

Referring to FIG. 2D, channel materials may be provided, for example, coated on the gate insulating layer 14 by using physical vapor deposition (PVD), chemical vapor deposition (CVD), or atomic layer deposition (ALD), and are patterned for the channel materials to remain on a region of the gate insulating layer 14 corresponding to the gate electrode 13, thereby forming the channel 15. The channel 15 may be formed of indium (In) oxide having hafnium (Hf) added therein. When the channel 15 is formed by using a sputtering process, a target formed of an indium (In) oxide and a target formed of a hafnium (Hf) metal may be provided in a process chamber and the channel 15 may be formed by using a cosputtering process. In addition, a single target, in which a hafnium (Hf) element is added to an indium (In) oxide, may be used.

Figure 2E:
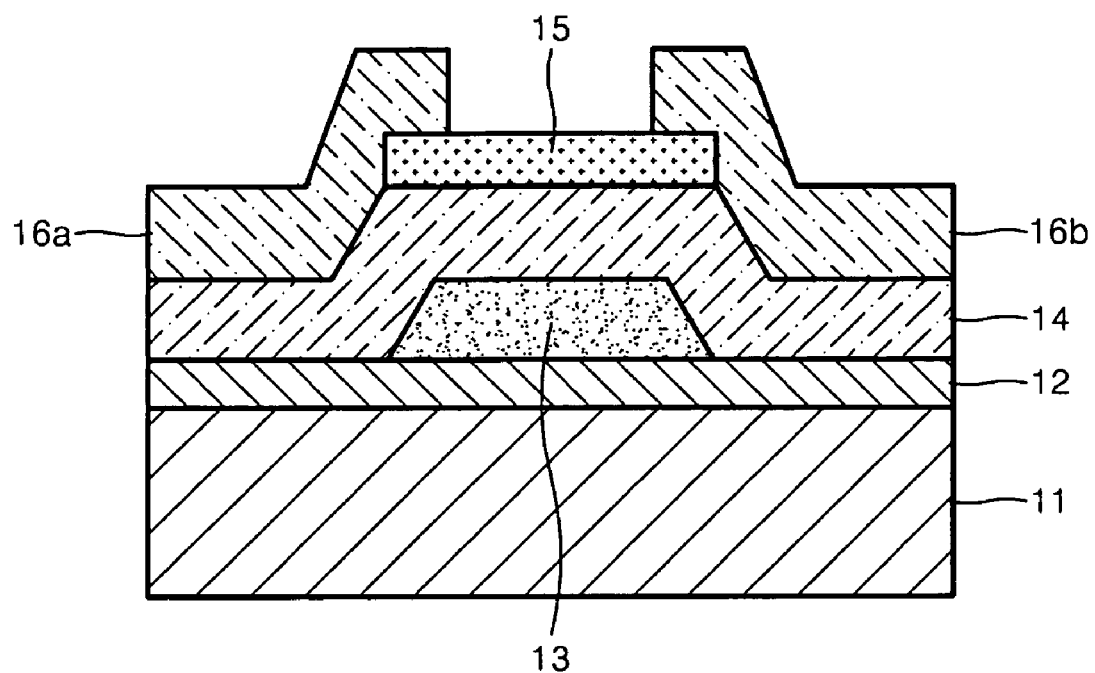

Referring to FIG. 2E, materials, e.g., metals or conductive metal oxides, may be provided, for example, coated on the channel 15 and the gate insulating layer 14 and may be patterned to be connected to opposite sides of the channel 15, thereby forming the source 16a and the drain 16b. A heat treatment may be performed at about 400° C. or below, for example, at about 200° C, using a furnace, rapid thermal annealing (RTA), laser, or a hot plate.

Manufacture Example

A substrate, in which a silicon oxide is formed on silicon to have a thickness of 100 nm, is prepared. A gate formed of molybdenum (Mo) and having a thickness of 200 nm is formed on a portion of the surface of the substrate, and silicon nitride is coated on the substrate and the gate to have a thickness of 200 nm, thereby forming a gate insulating layer. An oxide semiconductor is coated on a region of the gate insulating layer that corresponds to the gate, thereby forming a channel. Forming the channel is as follows. An indium (In) oxide target manufactured by Kojundo and a 99.9% hafnium (Hf) target manufactured by LTS are used. The targets are provided in a sputtering chamber (manufacture by Varian, model name—MS100).

The gas pressure of the sputtering chamber is maintained at 5 mTorr and maintains $O_2$ and argon (Ar) gas at $O_2$:Ar=5:95 vol % and at room temperature, and cosputtering is performed while a current delivering about 150 watts is applied to the indium (In) oxide target and a current delivering about 15 to about 30 watts is applied to the hafnium (Hf) target. Thus, an oxide semiconductor thin film including an indium (In) oxide and hafnium (Hf), having a thickness of about 70 nm, is coated on the region of the gate insulating layer that corresponds to the gate, thereby forming the channel. A double layer formed of Ti and Pt having a thickness of 10 nm and 100 nm, respectively, is formed on opposite sides of the channel as a source and a drain, respectively. Heat treatment is performed for about one hour at about 200° C. An inductively coupled plasma (ICP) analysis is performed on the manufactured thin film oxide and results in an atomic ratio of indium (In) to hafnium (Hf) of 98.5 at %:0:1.5 at %. Drain current (Id) values with respect to gate voltages (Vg) are measured for the oxide semiconductor manufactured according to example embodiments.

Figure 3:
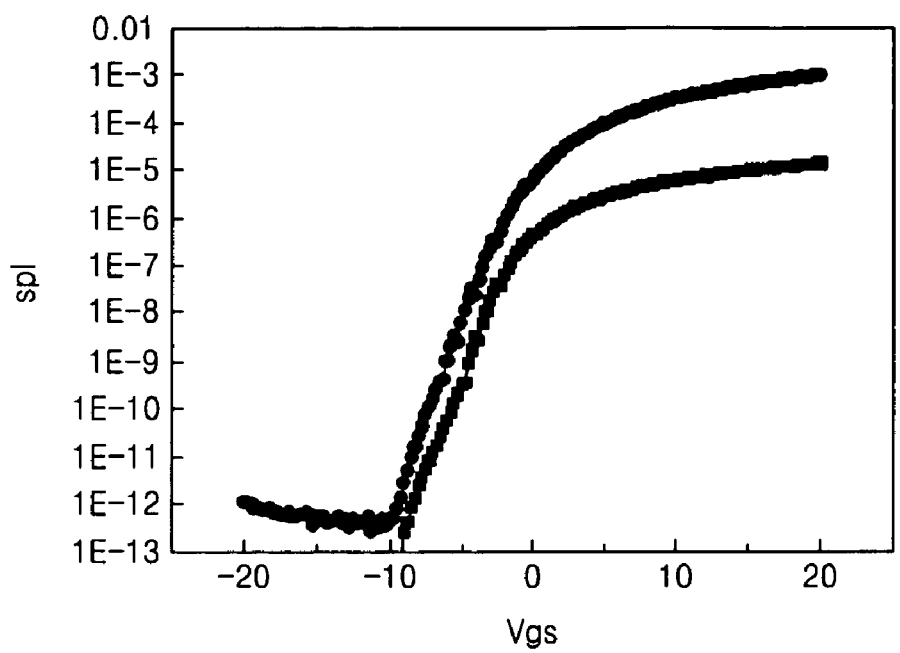
FIG. 3 is a graph illustrating drain current values with respect to gate voltages for an oxide TFT including a channel material formed of an indium (In) oxide and hafnium (Hf)

FIG. 3 is a graph illustrating the drain current (Id) values with respect to gate voltages (Vg) for the manufactured oxide TFT. A plot represented by ● is a plot when the gate voltage is 10 V and a plot represented by ■ is a transfer curve when the gate voltage is 0.1 V. The width and the length of the TFT are, respectively, about 40☐ and about 4☐. Referring to FIG. 3, mobility is 18.6 cm2/Vs and off-current is Ioff<1 pA or below, thereby showing improved performance, compared with an a-Si TFT. In addition, the difference between on-current and off-current shows Ion/Ioff>108 or above.

Figure 4:
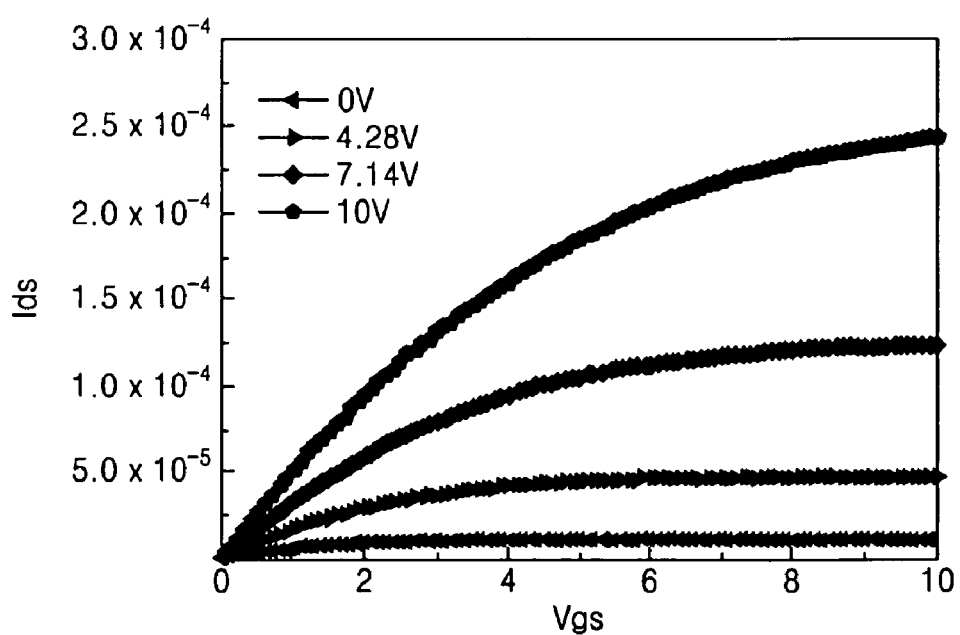
FIG. 4 is a graph illustrating drain current values with respect to drain voltage changes in an oxide TFT including a channel material formed of an indium (In) oxide and hafnium (Hf)

FIG. 4 is an output graph illustrating drain current (Ids) values with respect to drain voltage (Vds), when gate voltages of 0 V, 4.28 V, 7.14 V, and 10V are applied to the manufactured oxide TFT. Referring to FIG. 4, as the gate voltages increase and drain voltages increase, the drain current values gradually increases.

Figure 5:
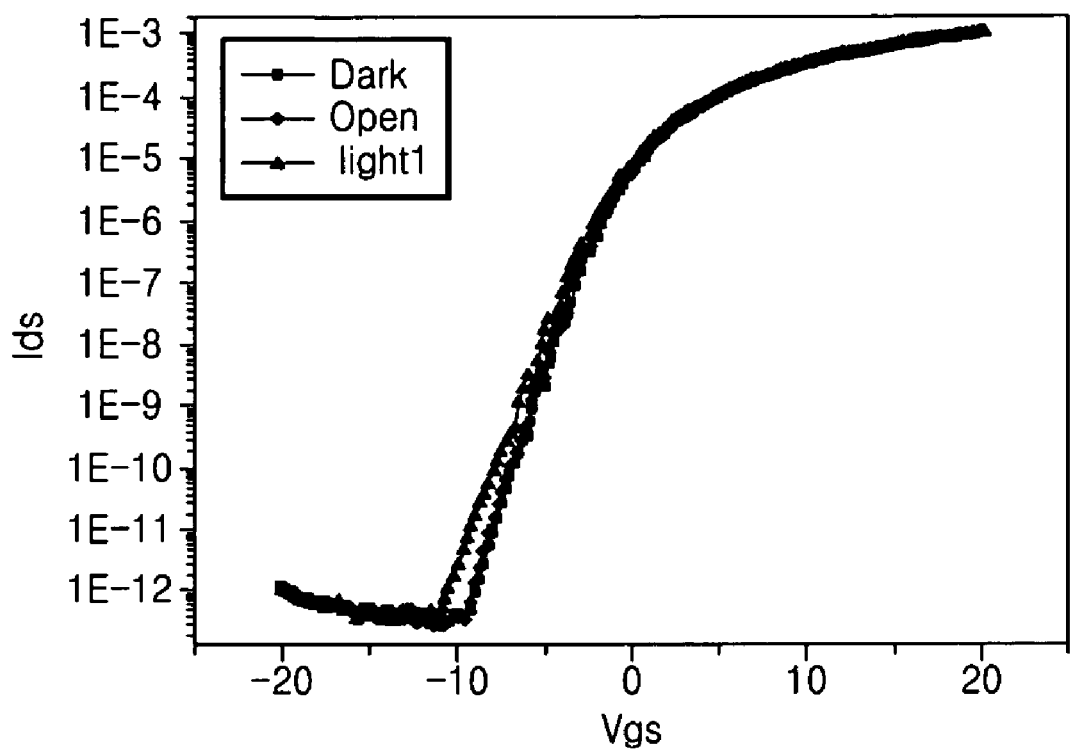
FIG. 5 is a graph illustrating optical stability of an oxide TFT including a channel material, formed of an indium (In) oxide and hafnium (Hf).

FIG. 5 is a graph illustrating optical stability of the manufactured oxide TFT including the channel material formed of an indium (In) oxide and hafnium (Hf), and showing the drain current (Ids) values with respect to gate voltages (Vgs) based on optical irradiation. 'Dark' denotes when light is blocked to a sample, 'Open' denotes when the sample is exposed to natural light (when a door opens), and 'Light 1' denotes when lamp light is directly irradiated on the manufactured oxide TFT. Referring to FIG. 5, movement of the transfer curve when applying light and when blocking light is not significant. Accordingly, changes in the manufactured oxide TFT properties according to surroundings, in particular, change in amounts of external light, are not significant and consequently, reliability is improved.

A composition ratio of the deposited thin film, graphs showing TFT properties, and mobility of the TFT may vary according to the types of targets used, applied voltages to the targets during deposition, deposition equipments, deposition pressure, partial pressure of oxygen, and/or substrate temperature. For example, in a case of using two types of targets, e.g., an indium (In) oxide target and a hafnium (Hf) target, composition of the deposited thin film may differ to when a single target of an Hf—In oxide is used. Also, when the compositions of the deposited thin films are equal, properties of the thin films may vary according to the deposition under different conditions. For example, when the oxide semiconductor is deposited using sputtering, the resistance range of the oxide may be changed according to the partial pressure of oxygen. When the partial pressure of oxygen is below an appropriate amount, a thin film having lower resistance may be deposited, and when the oxygen partial pressure is adjusted to above an appropriate amount, a thin film having higher resistance may be deposited.

As described above, according to example embodiments, manufacturing various electronic devices, e.g., driving transistors of flat panel displays, for example, LCD and OLED, and transistors for forming peripheral circuits of memory devices is possible using an oxide semiconductor. The oxide TFT according to example embodiments may be used as a bottom gate type or a top gate type.

It should be understood that example embodiments described therein should be considered in a descriptive sense only and not for purposes of limitation. Descriptions of features or aspects within each embodiment should typically be considered as available for other similar features or aspects in other example embodiments.

What is claimed is:

1. An oxide semiconductor comprising an indium (In) oxide and hafnium (Hf), wherein an atomic ratio of Hf is in the range of about 0 at %<Hf(at %)≦10 at %.

2. The oxide semiconductor of claim 1, wherein the atomic ratio of Hf is in the range of about 0 at %<Hf(at %)≦2 at %.

3. The oxide semiconductor of claim 2, wherein the atomic ratio of Hf is in the range of about 0 at %<Hf(at %)≦1.5 at %.

4. The oxide semiconductor of claim 1, further comprising Group I elements, Group II elements, Group III elements, Group IV elements, Group V elements, or Lanthanide (Ln) based elements.

5. The oxide semiconductor of claim 1, wherein the oxide semiconductor is amorphous.

6. The oxide semiconductor of claim 1, wherein the oxide semiconductor has a mixed amorphous and crystalline structure.

7. The oxide semiconductor of claim 1, wherein the oxide semiconductor has a crystalline structure.

8. An oxide thin film transistor comprising:
a gate;
a channel including the oxide semiconductor of claim 1, corresponding to the gate;
a gate insulating layer between the gate and the channel; and
a source and a drain contacting opposite sides of the channel.

9. The oxide thin film transistor of claim 8, wherein the atomic ratio of Hf is in the range of 0 at %<Hf(at %)≦2 at %.

10. The oxide thin film transistor of claim 9, wherein the atomic ratio of Hf is in the range of 0 at %<Hf(at %)≦1.5 at %.

11. The oxide thin film transistor of claim 8, wherein the channel further comprises Group I elements, Group II elements, Group III elements, Group IV elements, Group V elements, or lanthanide (Ln) based elements.

12. The oxide thin film transistor of claim 8, wherein the oxide semiconductor is amorphous.

13. The oxide thin film transistor of claim 8, wherein the oxide semiconductor has a mixed amorphous and crystalline structure.

14. The oxide thin film transistor of claim 8, wherein the oxide semiconductor has a crystalline structure.

15. The oxide thin film transistor of claim 8, wherein the gate, the source and the drain are formed of titanium (Ti), platinum (Pt), ruthenium (Ru), gold (Au), silver (Ag), molybdenum (Mo), aluminum (Al), tungsten (W), copper (Cu), IZO (InZnO) or AZO (AlZnO).

16. The oxide thin film transistor of claim 8, wherein the gate insulating layer is formed of $SiO_2$, a high-k material having higher permittivity than that of $SiO_2$, or a mixture thereof.

17. The oxide thin film transistor of claim 8, wherein the oxide thin film transistor is a bottom gate type or top gate type.

18. A display comprising the oxide thin film transistor of claim 8 as a switching device.

* * * * *